United States Patent [19]
Torii et al.

[11] Patent Number: 6,147,499
[45] Date of Patent: Nov. 14, 2000

[54] INSTRUMENT FOR MEASURING VOLTAGES OF CELLS

[75] Inventors: Yuji Torii; Toshiaki Nakanishi, both of Toyohashi, Japan

[73] Assignee: Matsushita Electric Industrial Co., Ltd., Osaka, Japan

[21] Appl. No.: 09/308,445

[22] PCT Filed: Sep. 30, 1998

[86] PCT No.: PCT/JP98/04438

§ 371 Date: May 19, 1999

§ 102(e) Date: May 19, 1999

[87] PCT Pub. No.: WO99/17123

PCT Pub. Date: Apr. 8, 1999

[30] Foreign Application Priority Data

Sep. 30, 1997 [JP] Japan .................................... 9-266065

[51] Int. Cl.⁷ ............................ H02J 7/00; G01N 27/416
[52] U.S. Cl. ........................................... 324/434; 320/119
[58] Field of Search .................................... 324/434, 433; 320/116, 119; 340/636

[56] References Cited

U.S. PATENT DOCUMENTS

| | | | |
|---|---|---|---|
| 4,290,014 | 9/1981 | Tremaine | 324/77 A |
| 5,254,951 | 10/1993 | Goto et al. | 324/426 |
| 5,287,286 | 2/1994 | Ninomiya . | |
| 5,302,902 | 4/1994 | Groehl | 324/434 |
| 5,625,272 | 4/1997 | Takahashi | 320/116 |
| 5,652,501 | 7/1997 | McClure et al. | 340/636 |

FOREIGN PATENT DOCUMENTS

| | | |
|---|---|---|
| 8-339829 | 12/1996 | Japan . |
| 9-007640 | 1/1997 | Japan . |
| 9-159701 | 6/1997 | Japan . |
| 9-171064 | 6/1997 | Japan . |
| WO88/04776 | 6/1988 | WIPO . |
| WO91/19328 | 12/1991 | WIPO . |
| WO96/32651 | 10/1996 | WIPO . |

*Primary Examiner*—Peter S. Wong
*Assistant Examiner*—Gregory J. Toatley
*Attorney, Agent, or Firm*—Jordan and Hamburg LLP

[57] ABSTRACT

Differential amplifiers (2) are provided to each of the batteries (1) for obtaining output voltages corresponding to the two terminal voltages of each battery (1). These differential amplifiers (2) are divided into groups (5) of a suitable number, and for each group (5), mutually insulated ground terminals (6) and mutually insulated control power sources (7) are provided. Each control power source (7) is connected between the power source terminal (2a) of each differential amplifier (2) and each ground terminal (6) of the respective group (5).

3 Claims, 4 Drawing Sheets

Fig. 2
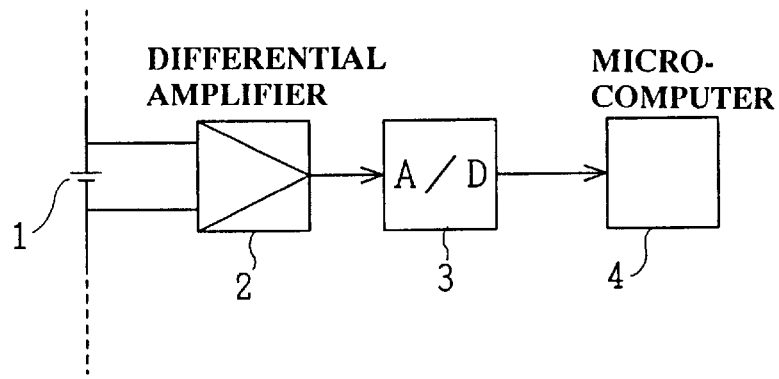
Fig. 3(a) Prior Art    Fig. 3(b) Prior Art
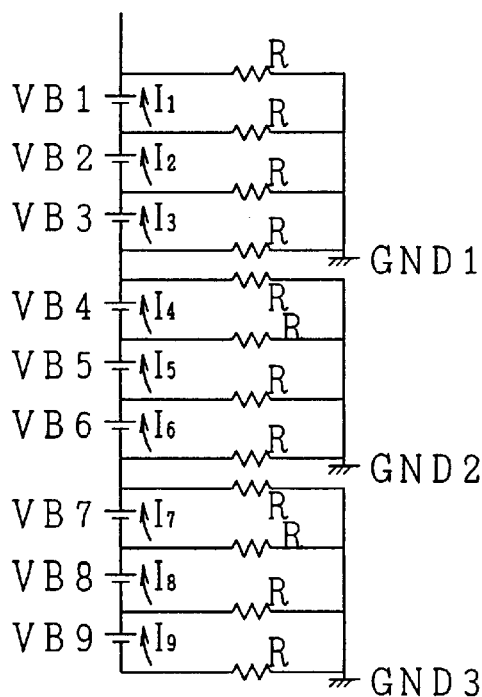
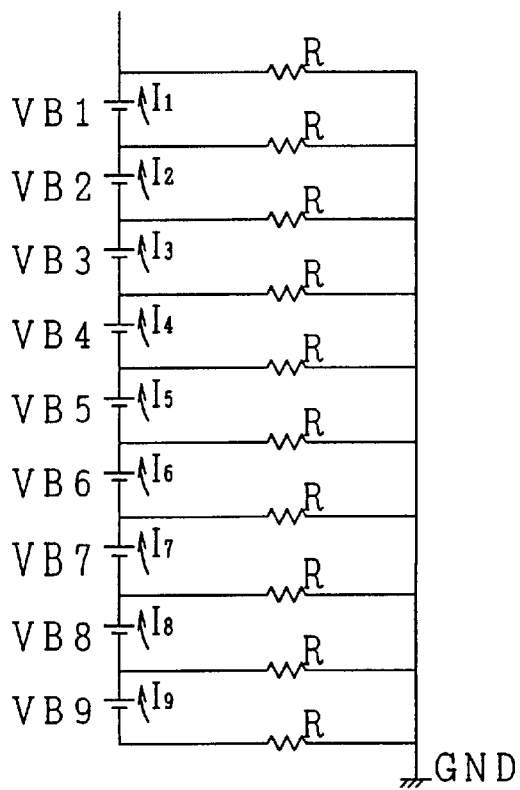

INSTRUMENT FOR MEASURING VOLTAGES OF CELLS

TECHNICAL FIELD

The present invention relates to a battery voltage measurement device and in particular to a battery voltage measurement device that is ideally suited to voltage measurement of each of the secondary batteries in a power source device wherein a large number of secondary batteries are connected in series.

BACKGROUND ART

In power source devices in for example electric vehicles, an arrangement is adopted whereby a large number of secondary batteries are connected in series to obtain a prescribed drive voltage. In order to ensure reliability and stability of such power source devices, it is necessary to constantly monitor the respective conditions of each of the secondary batteries. For this purpose, it is known to provide a battery voltage measurement device for measuring the voltage at both terminals of each secondary battery.

In such a prior art battery voltage measurement device of this type, as shown in FIG. 4, to each secondary battery 11 there are connected a differential amplifier 12 for obtaining output voltage corresponding to its two terminal voltages and a gain trimmming amplifier 13 for performing gain trimmming of this output voltage. Further, as shown in FIG. 5, the output voltage from each gain trimming amplifier 13 is converted into a digital value by an A/D converter 14 respectively provided corresponding thereto and the digital signal corresponding to the voltage of the two terminals of each secondary battery 11 is input to a microcomputer 15, and the voltage of each secondary battery 11 is thereby detected. As shown in FIG. 4, all the differential amplifiers 12 have their power source terminals and ground terminals respectively connected in common, and power source voltage Vcc is applied by connecting a common control power source between their power source terminals and ground terminals, and their ground terminals are connected to a common ground GND.

The reason for performing respective gain trimmming by connecting gain trimmming amplifiers 13 to each differential amplifier 12 is as follows. In order to achieve digital conversion of the output voltages of the differential amplifiers 12 so that these can be sent to microcomputer 15, the gains of differential amplifiers 12 must be matched with the voltage range of the A/D converter 14 in which input is possible. For example, if the detection range of the battery voltage is 0 to 20V and the input voltage range of A/D converter 14 is 0 to 5V, the battery voltage at differential amplifier 12 must be output multiplied by a factor of ¼.

However, the differential amplifiers 12 have an in-phase input range consisting of the voltage range in which they can operate normally by application of voltage to their input terminals and are subject to restriction in regard to their input voltage range, depending on the device characteristics and power source voltage. For example, when a certain device is used as a differential amplifier 12, its in-phase input range, when the power source voltage VCC is +15V, is 14V. This in-phase input range differs somewhat depending on the device used to constitute differential amplifier 12 but in general is a value a little lower than the +15V of the power source voltage Vcc, so its value may be taken as 14V. On the other hand, since a large number of secondary batteries 11 are connected in series, as shown in FIG. 6, it may happen that the voltage Va of one terminal of a given secondary battery 11 is for example 200V with respect to ground; in such a case, too, it is necessary to ensure that the input voltage Vb does not exceed 14V, which is the in-phase input range. Consequently, in regard to $R_1$ and $R_2$ of FIG. 6, $R_2/R_1$ must be made $\leq 14(200-14)$ and in this case the gain of the differential amplifier 12 has to be below $R_2/R_1$ (=7/93). Accordingly, in order to match the input range of the above A/D converter, a gain trimmming amplifier 13 of gain $R_1/4R_2$ (=93/28) is required.

However, there was the problem that in the above construction costs were greatly increased by the need to provide gain trimmming amplifiers 13 for each differential amplifier 12 i.e. for each secondary battery 11.

Also, a background current flows from each secondary battery 11 to the differential amplifiers 12 provided for respective voltage measurement. If this background current was large, there was the problem that if the batteries were left for a long period without charging this resulted in over-discharge, causing deterioration of performance such as decrease of battery capacity and/or rise in internal resistance. There was also the problem that, if there were differences in the background current values between the series-connected secondary batteries 11, this resulted in large variability of capacity between the individual secondary batteries. If control was exercised based solely on the center value of capacity, some batteries would be found to be over-charged or over-discharged, making it necessary to use them in such a way that such over-charging/discharging did not occur and so giving rise to a reduction in the range of allowable use. Also, if left for a long period without charging, due to variability of the residual capacity, the reduced capacity of some secondary batteries resulted in even further discharging of the other secondary batteries, tending to produce deterioration of battery performance. Thus the challenges were presented of making the background current small and making the difference between the individual secondary batteries 11 small.

However, since in the above construction the differential amplifiers 12 were connected in common to ground GND, their equivalent circuit was as shown in FIG. 3(b). FIG. 3 shows by way of example a case in which nine secondary batteries 11 are connected in series. Taking the battery voltages of the individual secondary batteries as VB1 to VB9, the equivalent impedance at the differential amplifier 12 as R, the background currents from the individual secondary batteries 11 as $I_1$ to $I_9$, if for example VB1 to VB9 are assumed to be 15V and R to be 1 MΩ, $I_1=I_9=67.5$ μA, $I_2=I_8=120.0$ μA, $I_3=I_7=157.5$ μA, $I_4=I_6=180.0$ μA, and $I_5=187.5$ μA. Thus the background currents in the secondary batteries 11 are large with a maximum of 180.0 μA and the difference in the background currents is a maximum of 120 μA (this reaches 67% of the maximum background current value of 180.0 μA). Thus there was the problem that the aforementioned challenges could not be met.

In the light of the above problems of the prior art, an object of the present invention is to provide a battery voltage measurement device wherein costs can be reduced by eliminating the need to provide gain trimmming amplifiers for the differential amplifiers used to measure the battery voltages and wherein the background currents can be made small and their variability also made small.

DISCLOSURE OF THE INVENTION

According to the present invention, in a battery voltage measurement device for measuring respective voltages of a large number of batteries that are connected in series, differential amplifiers are provided that obtain output voltages corresponding to two terminal voltages of each battery, said differential amplifiers being divided into groups of a suitable number, each group being provided with a mutually insulated ground terminal and provided with a mutually insulated control power source, each control power source being connected between a power source input terminal of each differential amplifier and each ground terminal of the respective group. Thus, since the control power sources are connected between the power source input terminal and ground terminal in a mutually insulated condition in each group of the differential amplifiers, the voltage with respect to the respective ground terminal that is applied to the input terminal of each differential amplifier in each group becomes low. Consequently, the range of setting of the gains becomes wide, making it unnecessary to provide a gain trimmming amplifier; lower costs can thereby be achieved. Also, by making the number of differential amplifiers that are grounded in each group small, the maximum background current value becomes small so even if they are left without charging for a long time deterioration of the batteries is unlikely and variability of the background current value is small, so the requirement to restrict the range of use of the batteries in order to avoid over-charged or over-discharged batteries being produced can be eliminated.

Also, as a result, it becomes possible to directly connect the output terminal of each differential amplifier to means for A/D conversion that digitally converts the output voltage signal, and to connect the means for A/D conversion to means for detection of the battery voltage from this output signal.

It should be noted that the above-mentioned batteries are not restricted to single cells but could of course be modules obtained by connecting a plurality of cells.

BRIEF DESCRIPTION OF THE DRAWINGS

FIG. 2 is an overall layout diagram of a portion of the battery voltage measurement device of this embodiment corresponding to a single battery;

FIG. 3(*a*) is a diagram of the background current of this embodiment and

FIG. 3(*b*) is a diagram of an equivalent circuit of the prior art;

BEST MODE FOR CARRYING OUT THE INVENTION

An embodiment of a battery voltage measurement device according to the present invention is described below with reference to FIG. 1 to FIG. 3.

Figure 1:
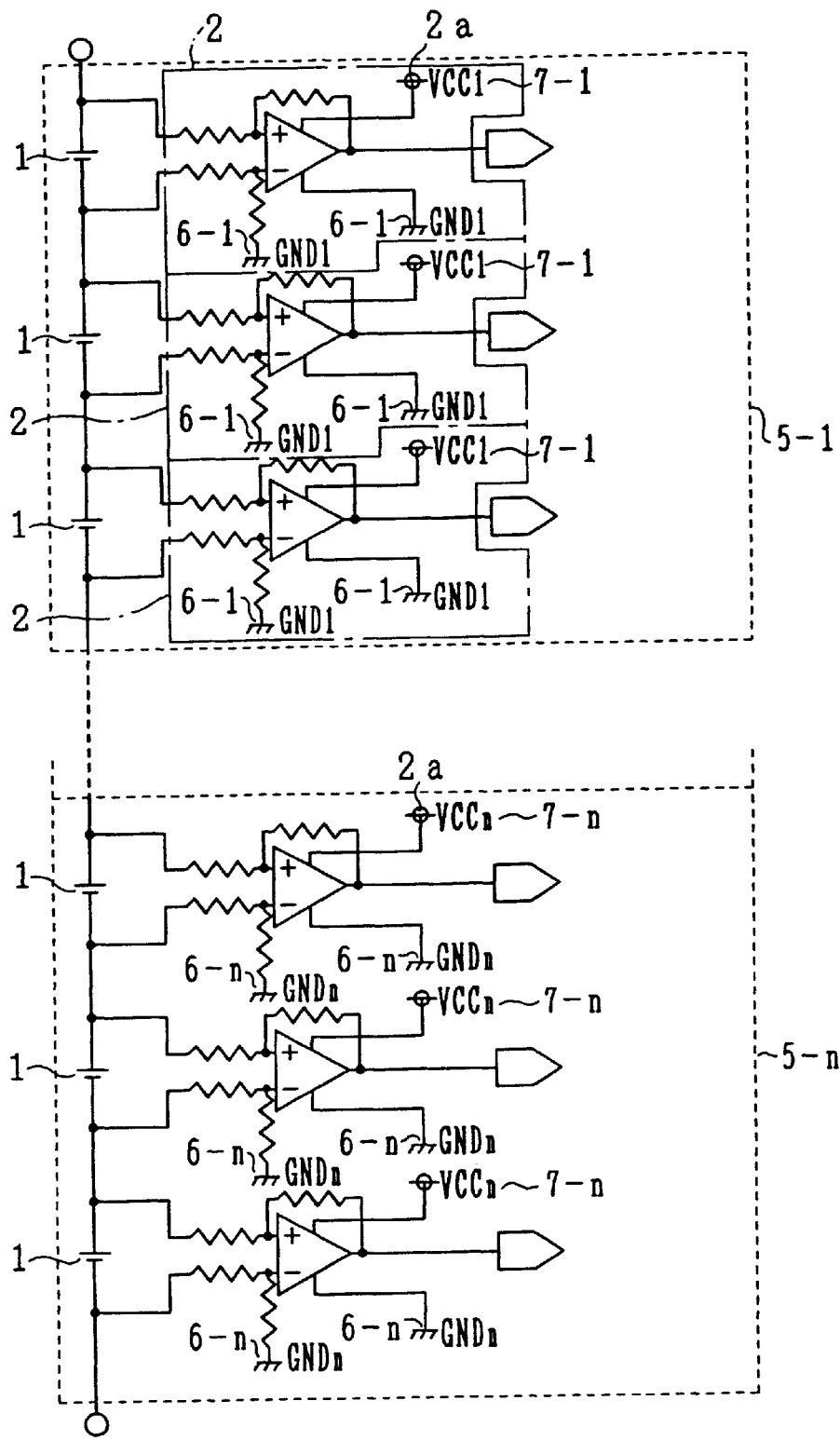
FIG. 1 is a layout diagram of major parts of a battery voltage measurement device according to an embodiment of the present invention.
Figure 4:
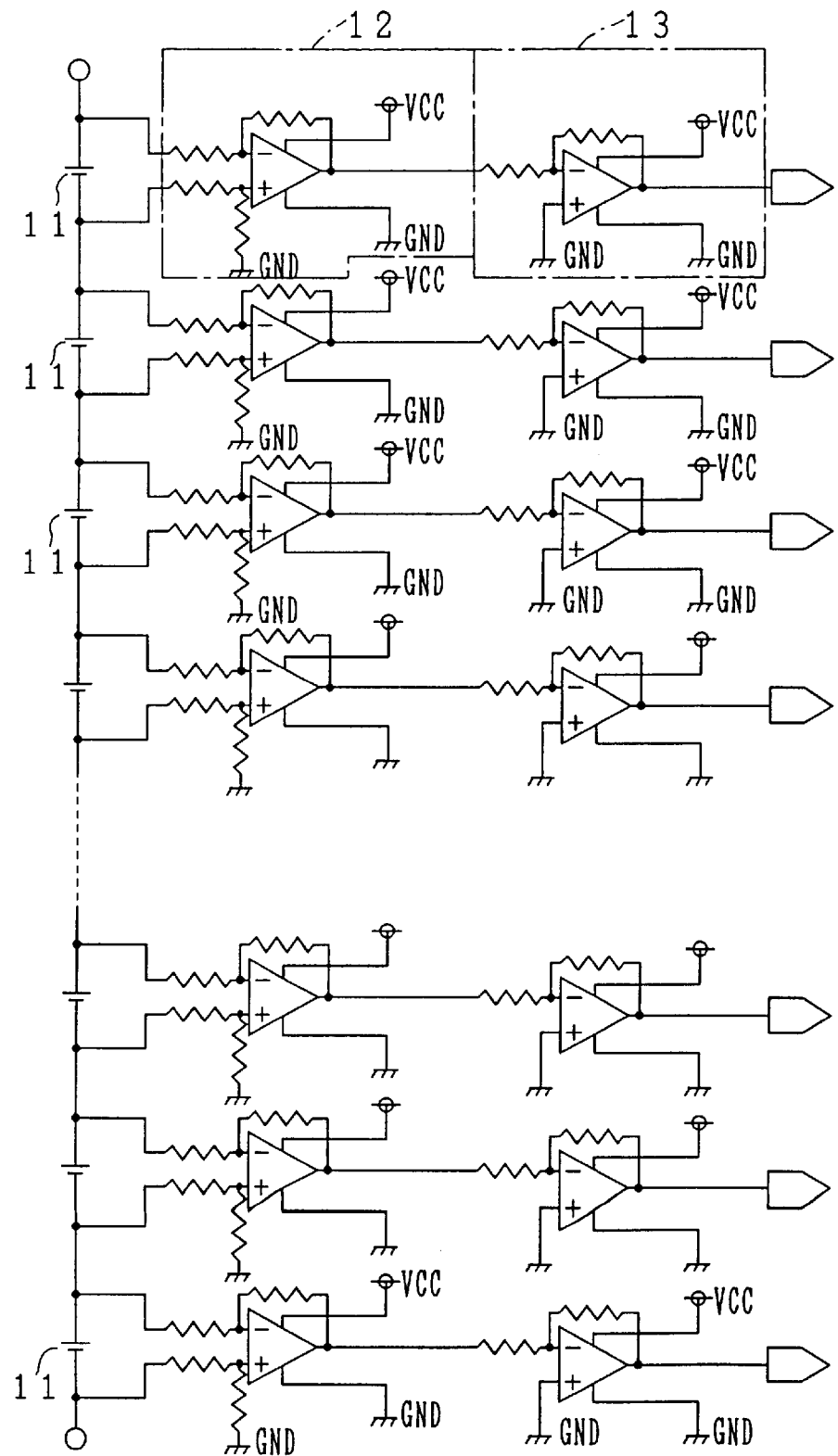
FIG. 4 is a layout diagram of a major portion of a prior example art battery voltage measurement device.
Figure 5:
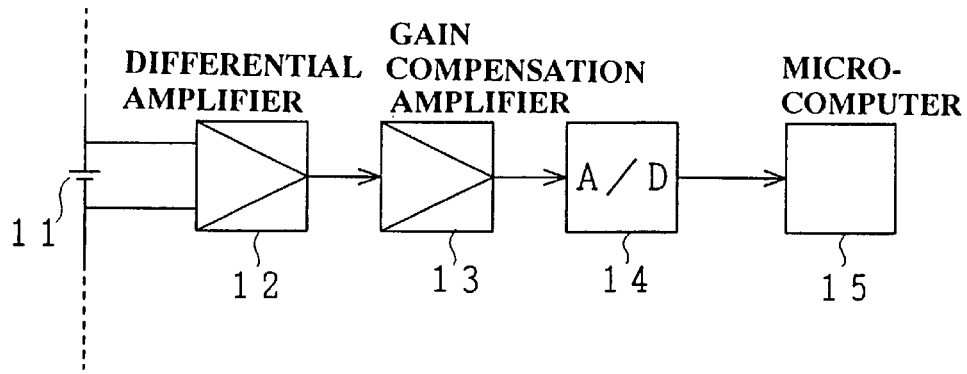
FIG. 5 is an overall layout diagram of a portion of the battery voltage measurement device of this prior art example corresponding to a single battery.

In FIG. 1, 1 is a secondary battery constituting a battery which is the subject of measurement; a plurality (for example six) battery cells are connected in series to constitute a module. A power source device for an electric vehicle or the like is constituted by connecting a large number of these secondary batteries 1 in series.

2 is a differential amplifier connected such as to detect the two terminal voltages of each secondary battery 1. Differential amplifiers 2 are divided into groups of suitable number, in the example illustrated, groups of three in each case, forming groups 5 (5-1 to 5-n). Each group is provided with mutually insulated ground terminals 6 (6-1 to 6-n) which are respectively individually grounded (GDN1 to GDNn) and are provided with mutually insulated control power sources 7 (7-1 to 7-n)(VCC1 to VCCn). The control power sources 7 (7-1 to 7-n) are respectively connected to a power source transformer through insulating DC/DC converters. Each control power source 7 (7-1 to 7-n) is connected between power source input terminal 2*a* of each differential amplifier 2 and the corresponding ground terminal 6 (6-1 to 6-n).

In FIG. 2, each differential amplifier 2 is directly connected to an A/D converter 3. A/D converter 3 converts the output signal of differential amplifier 2 into a digital signal and outputs it to microcomputer 4. 4 is the microcomputer that detects the two terminal voltages of each secondary battery 1 from these input digital signals.

In the above arrangement, the two terminal voltages of each secondary battery 1 are input to differential amplifier 2, output voltage signals (analogue signals) corresponding to the two terminal voltages of each secondary battery 1 are input to A/D converter 3, converted to a digital signal by A/D converter 3, and output to microcomputer 4. Microcomputer 4 converts the input digital signals to voltage values with the required read timing, and detects the two terminal voltages of secondary battery 1 from these voltage values. Thus in this way, the output voltage of each secondary battery 1 of the power source device constituted by series-connecting a large number of secondary batteries 1 is detected, thereby making it possible to constantly monitor the respective condition of each secondary battery 1 in an accurate fashion, and so enabling reliability and stability of the power source device to be guaranteed.

Figure 6:
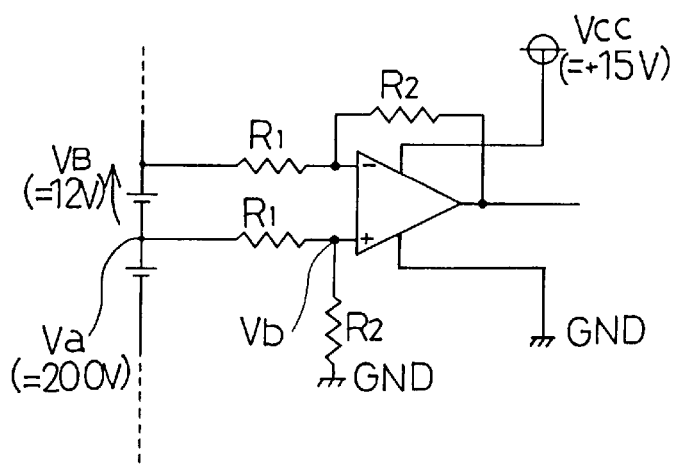
FIG. 6 is a diagram given in explanation of the set gain in a differential amplifier of this prior art example.

In this embodiment, since the differential amplifiers 2 are divided into groups 5-1 to 5-n of appropriate number in each case and mutually insulated control power sources 7 (7-1 to 7-n) are connected in each group between the ground terminal 6 (6-1 to 6-n)(GND1 to GNDn) that are in a mutually insulated condition in each group 5-1 to 5-n and the power source input terminal 2*a* of each such differential amplifier 2, thereby applying control voltages VCC1 to VCCn in each group, the voltage with respect to the respective ground terminals 6 (6-1 to 6-n)(GND1 to GNDn) of the voltage (voltage Va in FIG. 6) applied to the input terminal of each differential amplifier 2 in each group 5 (5-1 to 5-n) is made lower. As a result, the range of setting of the gains of differential amplifiers 2 becomes wide, making it unnecessary to provide a gain trimmming amplifier such as was provided in the prior art example; a very considerable saving in costs can thereby be achieved.

Also, by keeping the number of differential amplifiers 2 in each group 5 small (three in the case of the present embodiment), the background current is given by an equivalent circuit as shown in FIG. 3(*a*). Specifically, taking the battery voltages of the individual secondary batteries 1 as VB1 to VB9, the equivalent impedance at the differential amplifier 2 as R, the background currents from the individual secondary batteries 1 as $I_1$ to $I_9$, if for example VB1 to VB9 are assumed to be 15V and R to be 1 MΩ, $I_1=I_3=I_4=I_6=I_7=I_9=22.5$ μA, $I_2=I_5=I_8=30.0$ μA, the background currents in each secondary battery 1 are much reduced compared with the prior art example, being a maximum of 30.0 μA and the difference of the background currents is a maximum of 7.5 μA (25% of the maximum background current value of 30.0 μA).

Thus the background current values become small, and even if left for a long time without charging, deterioration of the batteries is unlikely. Also, the variability of the background current is small at 25% of the maximum background current value, so the requirement to restrict the range of use of the batteries in order to avoid over-charged or over-discharged batteries being produced can be eliminated and over-discharging due to differences in residual capacity can also be eliminated.

INDUSTRIAL APPLICABILITY

With the present invention, as will be clear from the above description, there is no need to provide gain trimmming amplifiers corresponding to each differential amplifier so a lowering of costs can be achieved. Also the maximum background current values can be made small and their variability can be made small. Consequently the range of use of the batteries that must be set in order to prevent over-discharging or over-charging produced by differences in residual capacity of the batteries can be wider. The present invention is therefore of utility as a battery voltage measurement device in a power source device.

What is claimed is:

1. A battery voltage measurement device for measuring respective voltages of a plurality of batteries that are connected in series, comprising differential amplifiers for obtaining output voltages corresponding to two terminal voltages of each battery, said differential amplifiers being divided into groups of a suitable number, each group being provided with a mutually insulated ground terminal and with a mutually insulated control power source, each control power source being connected between a power source input terminal of each differential amplifier and each ground terminal of the respective group.

2. The battery voltage measurement device according to claim 1, wherein the output terminal of each differential amplifier is directly connected to means for A/D conversion that digitally converts the output voltage signal, and said means for A/D conversion are connected to means for detection of the battery voltage from this output signal.

3. The battery voltage measurement device according to claim 1 wherein said plurality of batteries includes a large number of batteries producing a voltage greater than an input range of said differential amplifiers.

* * * * *